United States Patent [19]

Lampert et al.

[11] Patent Number: 5,262,229

[45] Date of Patent: Nov. 16, 1993

[54] CONDUCTIVE RELEASABLE ADHESIVE AND METHOD OF MAKING SAME

[75] Inventors: Bruce G. Lampert, Easton; William Klein, Stoughton, both of Mass.

[73] Assignee: United Technical Products, Inc., Del.

[21] Appl. No.: 787,372

[22] Filed: Nov. 4, 1991

[51] Int. Cl.⁵ .............................................. C09J 9/02
[52] U.S. Cl. .................................. 428/220; 428/261; 428/288; 428/290; 428/344; 428/356; 428/922; 524/424; 524/435
[58] Field of Search ................. 428/40, 261, 288, 290, 428/301, 344, 354, 356, 343, 922, 220; 524/424, 435

[56] References Cited

U.S. PATENT DOCUMENTS

| | | | |
|---|---|---|---|
| 3,347,978 | 10/1967 | Simon | 174/84 |
| 3,475,213 | 10/1969 | Stow | 428/344 |
| 4,457,796 | 7/1984 | Needham | 156/182 |
| 4,959,008 | 9/1990 | Wasulko | 428/40 |
| 4,961,804 | 10/1990 | Aurichio | 428/40 |

*Primary Examiner*—Jenna L. Davis

[57] ABSTRACT

A conductive releasable adhesive and method of making same for electrostatic discharge controlled surfaces in which a multiplicity of interlacing electrically conductive fibers is suspended in a releasable adhesional substance forming a conductive matrix throughout the volume of the adhesional substance for facilitating dissipation of electrical charges.

24 Claims, 1 Drawing Sheet

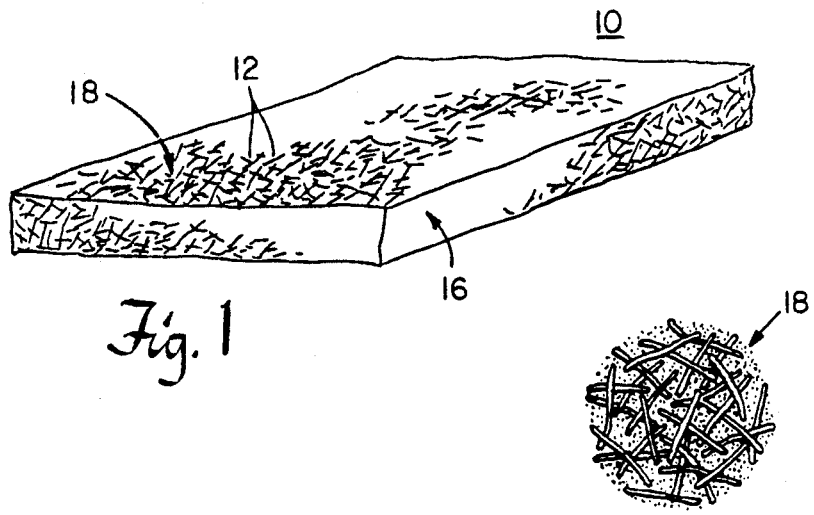
Fig. 1
Fig. 1A
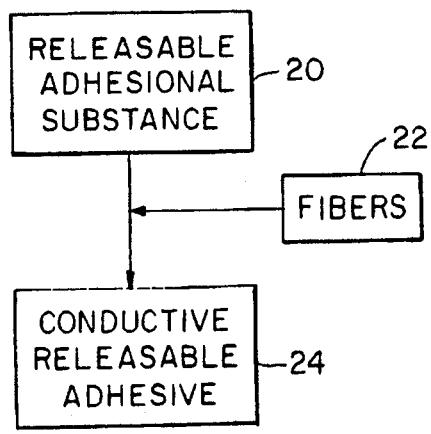
Fig. 2
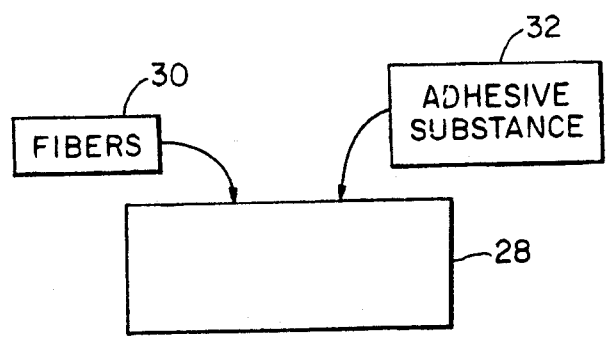
Fig. 3
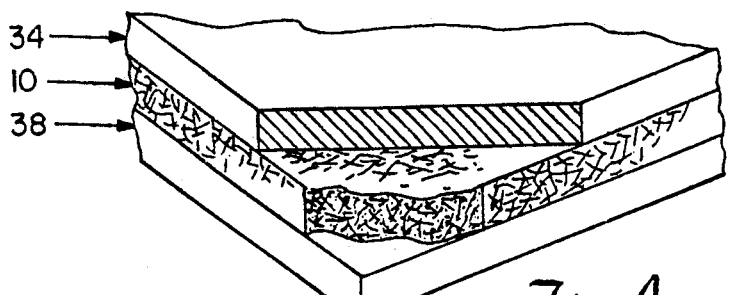
Fig. 4

CONDUCTIVE RELEASABLE ADHESIVE AND METHOD OF MAKING SAME

FIELD OF INVENTION

This invention relates to a conductive releasable adhesion for affixing electro-static discharge controlled surfaces to flooring and other surfaces and a method of making it.

BACKGROUND OF INVENTION

Static electricity causes problems ranging from a mere nuisance to degradation and catastrophic failures of electrical devices when tribo-electric charges build up on a person and are then discharged into electronic equipment upon contact. The advent of large scale integration of electrical components has resulted in even greater sensitivity to electro-static discharge ("ESD"). One estimate of the cost of ESD-caused information loss, disruption, and damaged equipment is as high as $10 billion per year. Consequently, many methods have been employed to combat ESD in manufacturing and other facilities where sensitive electronic components are exposed.

With regard to ESD controlled surfaces such as floors, it has become apparent that a major component of the total electrical continuity sought to be achieved in preventing ESD is the adhesive used to secure the ESD floor covering. This is because in most work environments, the floor is one of the largest single surfaces and the primary source of static-charge buildup. To combat this problem, conductive or static dissipative flooring is often applied, usually in the form of tiles, modules, or roll goods. The adhesive or cement used to secure the tiles to the existing flooring must itself provide for and facilitate continuous electrical continuity from tile to tile, and from tile to ground. Therefore, various conductive adhesives have been developed. The most generally used type is a conductive epoxy. Epoxies, by their nature, however, are nonreleasable and therefore not desirable for modular floors which otherwise allow for easy reconfiguration. Additionally, epoxy does not facilitate easy replacement of individual tiles which have become worn or damaged. There are other reasons epoxies are not desirable for many applications. Some epoxies require a long set-up time which disrupts operations and increases the overall cost associated with installing the ESD flooring. Because of its consistency, conductive epoxy is difficult to apply, further adding to the cost of installation. Additionally, epoxies involve a mixing of resin and hardener before application, and often require special handling and ventilation because of the strong odors generated by the epoxies. Generally, epoxies also have a very short mixed or pot life. Finally, epoxies are often difficult to correctly apply to achieve the desired conductivity and also difficult to clean off tools, furniture, and equipment. Most importantly, however, epoxy applied to ESD flooring does not allow the flooring to be easily reconfigured or releasable and does not allow easy replacement of worn or damaged individual tiles.

Modular ESD flooring in the form of tiles is desirable for many applications since a given area can be easily reconfigured and maintained. Furthermore, this type of ESD flooring allows easy access to wiring running in the floor. Releasable adhesives allow such reconfiguration and maintenance, but there is currently no effective releasable conductive adhesive for ESD flooring. Using releasable type adhesives, some attempts were made to develop a conductive adhesive for ESD flooring. For example, carbon black powders have been added to currently available releasable adhesives. The result, however, was that the carbon diluted the tackiness and strength of the dry adhesive rendering it unusable.

SUMMARY OF INVENTION

It is therefore a primary object of this invention to provide a releasable conductive adhesive for electro-static discharge controlled surfaces.

It is a further object of this invention to provide such a releasable conductive adhesive which is pressure sensitive.

It is a further object of this invention to provide a releasable conductive adhesive which has an ESD-safe surface electrical resistance.

It is a further object of this invention to provide a releasable conductive adhesive in which the conductive properties of the adhesive do not affect the tackiness and strength of the releasable adhesive.

This invention results from the realization that a conductive releasable adhesive for ESD controlled surfaces can be accomplished by suspending a multiplicity of conductive fibers interlaced in a releasable adhesional substance to form a conductive matrix capable of facilitating dissipation of electrical charges.

This invention features a conductive releasable adhesive for affixing ESD controlled surfaces to flooring or other surfaces. Conductive fibers are suspended in a releasable adhesional substance to form an interlaced conductive matrix that facilitates dissipation of electrical charges.

In a preferred embodiment, the adhesional substance may be a pressure sensitive acrylic polymer aqueous emulsion such as PARABOND ™ M-277, and the fibers may be acrylic fibers conductively coated with copper sulfide such as "Thunderon" synthetic conductive fibers and may have a Denier value of between 0.5 and 25. The fibers may have a length of between 0.5 and 15 mm, a diameter of 0.0005 to 0.0025 inch, and comprise from between 0.1 to 10 percent of the adhesive by weight thereby achieving an adhesive in which the fibers are inert with respect to the adhesional substance not affecting its tackiness or adhesive strength. These parameters achieve a adhesive which when applied to a non-conductive surface achieves a maximum surface electrical resistance of $2 \times 10^7$ ohms for ESD flooring.

The invention also features a method of making a conductive releasable adhesive for electrostatic discharge controlled surfaces including the steps of providing a releasable adhesional substance and mixing the adhesional substance with conductive fibers to suspend the fibers in the adhesional substance to form a conductive matrix throughout the volume of the adhesional substance.

In a preferred embodiment, a ribbon blender is used to mix the fibers with the adhesional substance.

DISCLOSURE OF PREFERRED EMBODIMENT

Other objects, features and advantages will occur to those skilled in the art from the following description of a preferred embodiment and the accompanying drawings, in which:

FIG. 1 is a schematic representation of a cross section of a quantity of the conductive releasable adhesive according to this invention;

FIG. 1A is a magnified view of the material according to this invention.

FIG. 2 is a block diagram showing a method of making the conductive releasable adhesive according to this invention;

FIG. 3 is a schematic diagram showing the mixing of conductive fibers with releasable adhesive according to the method of making the conductive releasable adhesive of this invention; and FIG. 4 is a cross-sectional schematic view of the conductive releasable adhesive according to this invention employed to secure an electrostatic discharge controlled surface to existing flooring.

This invention may be accomplished with acrylic fibers conductively coated with copper sulfide such as "Thunderon" synthetic conductive fibers suspended in a pressure sensitive releasable adhesional substance such as PARABOND TM M-277, forming an interlaced conductive matrix with an optimal surface electrical resistance for facilitating dissipation of electrical charges.

The fibers may be mixed with the adhesive in a blender and the resultant adhesive may be applied to an existing flooring and allowed to dry for a time before the electrostatic discharge controlled surface is applied. In this way, modular ESD flooring may be applied and since the adhesive is releasable, the flooring may be easily reconfigured and/or individual tiles can be easily replaced without disrupting operations taking place in the location where the ESD flooring is applied.

There is shown in FIG. 1 the conductive releasable adhesive 10 for ESD controlled surfaces according to this invention. Conductive fibers 12 are suspended in releasable adhesional substance 16 to form an interlaced conductive matrix 18. In a preferred embodiment, the releasable adhesional substance may be a pressure sensitive acrylic polymer aqueous emulsion such as PARABOND TM M-277. Also, the fibers may be acrylic fibers conductively coated with copper sulfide such as "Thunderon" synthetic conductive fibers having a Denier value of between 0.5 and 25, and a diameter of between 0.0005 to 0.0025 inch. Preferably, the strands have a length of between 0.5 and 15 mm and comprise from 0.1 to 10 percent of the adhesive by weight. Conductive fibers other than acrylic fibers coated with copper sulfide could be used as long as they form a conductive matrix with sufficient conductive properties. For example, carbon coated acrylic or propylene type conductive fibers could be used.

In a preferred embodiment, "Thunderon" fibers are used having a Denier value of 2, a diameter of about 0.0007 inch, and a length of about 5 mm, and comprising approximately 1% of the total wet weight of the adhesive. Experiments involving these parameters resulted in a conductive releasable adhesive which, before application of the ESD flooring, had a maximum surface electrical resistance of $2 \times 10^7$ ohms using the general testing methodology of ASTM F-150 at a potential of 100 volts. It has been determined that this is ideal for ESD protective floor coverings. Also, these levels have been achieved with fibers which are inert with respect to the releasable adhesional substance—that is, they do not adversely affect any of the inherent properties of the releasable adhesive. Furthermore, it has been found that these parameters result in an adhesive which is easy to apply. Using a 1/16 inch semi-circular notched trowel, the fibers are kept adequately suspended and are spread evenly forming an interlaced conductive matrix having the properties delineated above. Fibers too long get caught in the teeth of the trowel used to apply the adhesive or get caught on the roller used to spread the adhesive. Fibers too short do not provide the required conductive matrix unless cost prohibitive quantities of short fibers are added.

It has been established that the use of such a conductive releasable adhesive is cost effective over generally available conductive epoxies since the modular floor tiles are not destroyed upon removal and replacement during reconfiguration of a given space. Furthermore, the set-up time is often much shorter than that of common epoxies. Accordingly, the installation period is shorter, further lessening the costs associated with installation.

The fibers 12 are mixed at step 22 in FIG. 2 with the releasable adhesional substance, from step 20. This method results in the conductive releasable adhesive at step 24 with the above described properties.

Special ribbon blender 28, FIG. 3, may be used to mix the fibers 30 from step 22 of FIG. 2 with the adhesional substance 32 supplied at step 20, FIG. 2. In a preferred embodiment, after the releasable adhesional substance 16 is placed in special ribbon blender 28, small quantities of fibers 12 are slowly dispersed by hand into blender 28 near its perimeter while the blender operates at slow speed. As the quantity of fibers 12 is increased, blender speed is increased somewhat until the correct percentage of fibers 12 to adhesional substance 16 is achieved, and then the blender 28 is operated at full capacity for a time to assure proper dispersion of fibers 12 in adhesional substance 16. The fibers 12 tend to adhere to blades of the ribbon blender 28 if the blender speed is too fast and/or quantities of fibers 12 are added too quickly. Therefore, for best dispersion of fibers 12 in adhesional substance 16 to achieve the desired conductive matrix 18, the above gradual progression of increasing the quantity of fibers 12 at step 22, FIG. 2, as the speed of ribbon mixer 28, FIG. 3, increases is suggested.

As applied to secure an electrostatic discharge controlled surface 34 to existing flooring 38, FIG. 4, the conductive releasable adhesive 10 according to this invention allows the surface 34 to be modular since the adhesive 10 is releasable and yet it securely adheres the surface 34 to the existing flooring 38 since the fibers do not affect the releasable properties of the adhesive.

In application, flooring 38 is properly prepared and thoroughly cleaned. Using a 1/16 inch semicircular notched trowel, the conductive releasable adhesive is fully spread on the floor 38 to achieve coverage of approximately 30 yards per gallon. The adhesive 10 is allowed to dry for an average of two hours. As it dries, adhesive 10 turns from a cloudy to clear appearance if PARABOND TM M-277 is used as the releasable adhesional substance 16, FIG. 1, supplied at step 20, FIG. 2. Surface 34, for example ESD carpet tiles, is then applied. Adhesive 10 is easily removed from tools, etc., with soapy water followed by a rag dampened in chlorinated solvent. This ease of clean-up is a further advantage over epoxies.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A conductive releasable adhesive for electrostatic discharge controlled surfaces comprising:

a spreadable, releasable adhesional substance for dispersion between an electrostatic discharge controlled surface and a support surface; and a multiplicity of interlacing electrically conductive fibers suspended in said adhesional substance forming a conductive matrix throughout the volume of the adhesional substance for dissipating charges which come into contact with the electrostatic discharge controlled surface.

2. The adhesive of claim 1 in which said releasable adhesional substance is a pressure sensitive acrylic polymer aqueous emulsion.

3. The adhesive of claim 1 in which said fibers comprise from 0.1 to 10 percent of the adhesive by weight.

4. The adhesive of claim 1 in which fibers are inert with respect to said adhesional substance not adversely affecting the tackiness or adhesive strength of said adhesional substance.

5. The adhesive of claim 1 in which said fibers are acrylic fibers conductively coated with copper sulfide.

6. The adhesive of claim 1 in which said fibers are carbon coated nylon conductive fibers.

7. The adhesive of claim 1 in which said fibers are carbon coated acrylic conductive fibers.

8. The adhesive of claim 1 in which said fibers are carbon coated polypropylene conductive fibers.

9. The adhesive of claim 1 in which said fibers have a Denier value of between 0.5 and 25.

10. The adhesive of claim 1 in which said fibers have diameter of between 0.0005 to 0.0025 inches.

11. The adhesive of claim 1 in which said fibers have a length of between 0.5 to 15 mm.

12. The adhesive of claim 1 in which said conductive matrix has a maximum surface electrical resistance of $2 \times 10^7$ ohms.

13. A method of making a conductive releasable adhesive for electrostatic discharge controlled surfaces comprising:

providing a spreadable, releasable adhesional substance for releasably securing electrostatic discharge controlled surfaces to a support surface; and mixing said adhesional substance with a multiplicity of conductive fibers to suspend said fibers in said adhesional substance forming a conductive matrix throughout the volume of the adhesional substance.

14. The method of claim 13 in which said releasable adhesional substance is a pressure sensitive acrylic polymer aqueous emulsion.

15. The method of claim 13 in which said fibers comprise from 0.1 to 10% of the adhesive by weight.

16. The method of claim 13 in which said fibers are acrylic fibers conductively coated with copper sulfide.

17. The method of claim 13 in which said fibers are carbon coated nylon conductive fibers.

18. The method of claim 13 in which said fibers are carbon coated acrylic conductive fibers.

19. The method of claim 13 in which said fibers are carbon coated polypropylene conductive fibers.

20. The method of claim 13 in which said fibers have a Denier value of between 0.5 and 25.

21. The method of claim 13 in which said fibers have a diameter of between 0.0005 to 0.0025 inches.

22. The method of claim 13 in which said fibers have a length between 0.5 to 15 mm.

23. The method of claim 13 in which said mixing is accomplished by means of a ribbon blender.

24. The method of claim 13 in which said fibers are inert with respect to said adhesional substance not adversely affecting the tackiness adhesive strength of said adhesional substance.

* * * * *